(12) United States Patent
Shioda et al.

(10) Patent No.: US 8,872,158 B2
(45) Date of Patent: Oct. 28, 2014

(54) SEMICONDUCTOR LIGHT EMITTING DEVICE

(71) Applicant: Kabushiki Kaisha Toshiba, Minato-ku (JP)

(72) Inventors: Tomonari Shioda, Kanagawa-ken (JP); Hisashi Yoshida, Kanagawa-ken (JP); Naoharu Sugiyama, Kanagawa-ken (JP); Shinya Nunoue, Chiba-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/185,158

(22) Filed: Feb. 20, 2014

(65) Prior Publication Data
US 2014/0166978 A1    Jun. 19, 2014

Related U.S. Application Data

(62) Division of application No. 13/213,373, filed on Aug. 19, 2011, now Pat. No. 8,698,123.

(30) Foreign Application Priority Data

Feb. 25, 2011   (JP) .................................. 2011-39281

(51) Int. Cl.
| | |
|---|---|
| *H01L 29/06* | (2006.01) |
| *H01L 27/15* | (2006.01) |
| *H01L 33/32* | (2010.01) |
| *H01L 33/06* | (2010.01) |

(52) U.S. Cl.
CPC ................ *H01L 33/06* (2013.01); *H01L 33/32* (2013.01)
USPC ......................... 257/13; 257/79; 257/E33.008

(58) Field of Classification Search
USPC ........ 257/13–15, 79, 80, 82, 94, 98, E33.001, 257/E33.073, E33.063, E33.068, E31.003, 257/E31.032, E33.027
See application file for complete search history.

(56) References Cited

U.S. PATENT DOCUMENTS

2011/0168974 A1*  7/2011  Okuno ............................ 257/13

FOREIGN PATENT DOCUMENTS

| JP | 8-293643 | 11/1996 |
|---|---|---|
| JP | 10-12923 | 1/1998 |

(Continued)

OTHER PUBLICATIONS

Office Action issued Jan. 18, 2013 in Japanese Patent Application No. 2011-039281 with English language translation.

(Continued)

*Primary Examiner* — Selim Ahmed
(74) *Attorney, Agent, or Firm* — Oblon, Spivak, McClelland, Maier & Neustadt, L.L.P.

(57) ABSTRACT

According to one embodiment, a semiconductor light emitting device includes an n-type semiconductor layer, a p-type semiconductor layer, and a light emitting part. The n-type semiconductor layer includes a nitride semiconductor. The p-type semiconductor layer includes a nitride semiconductor. The light emitting part is provided between the n-type and the p-type semiconductor layers and includes an n-side barrier layer and a first light emitting layer. The first light emitting layer includes a first barrier layer, a first well layer, and a first AlGaN layer. The first barrier layer is provided between the n-side barrier layer and the p-type semiconductor layer. The first well layer contacts the n-side barrier layer between the n-side and the first barrier layer. The first AlGaN layer is provided between the first well layer and the first barrier layer. A peak wavelength $\lambda p$ of light emitted from the light emitting part is longer than 515 nanometers.

12 Claims, 5 Drawing Sheets

(56) References Cited

FOREIGN PATENT DOCUMENTS

| | | |
|---|---|---|
| JP | 2000-232259 | 8/2000 |
| JP | 2001-168471 | 6/2001 |
| JP | 2001-237457 | 8/2001 |
| JP | 2006-86164 | 3/2006 |
| JP | 2009-239083 | 10/2009 |
| JP | 2009-259885 | 11/2009 |
| JP | 2009-272606 | 11/2009 |
| JP | 2010-3913 | 1/2010 |
| JP | 2010-80619 | 4/2010 |

OTHER PUBLICATIONS

Office Action mailed Sep. 8, 2014 in Japanese Application No. 2013-210963 (w/English translation).

* cited by examiner

SEMICONDUCTOR LIGHT EMITTING DEVICE

CROSS-REFERENCE TO RELATED APPLICATIONS

This application is a division of and claims the benefit of priority under 35 U.S.C. §120 from U.S. Ser. No. 13/213,373 filed Aug. 19, 2011, and claims the benefit of priority under 35 U.S.C. §119 from Japanese Patent Application No. 2011-39281 filed Feb. 25, 2011; the entire contents of each of which are incorporated herein by reference.

FIELD

Embodiments described herein relate generally to a semiconductor light emitting device.

BACKGROUND

A light emitting diode (LED) which is a semiconductor light emitting device using a nitride semiconductor is used, for example, for a display apparatus, lighting apparatus or the like. A laser diode (LD) is used for a light source for reading or writing from or onto a high-density memory disc or the like.

For such semiconductor light emitting device, a higher luminance is demanded.

DETAILED DESCRIPTION

Figure 1A:
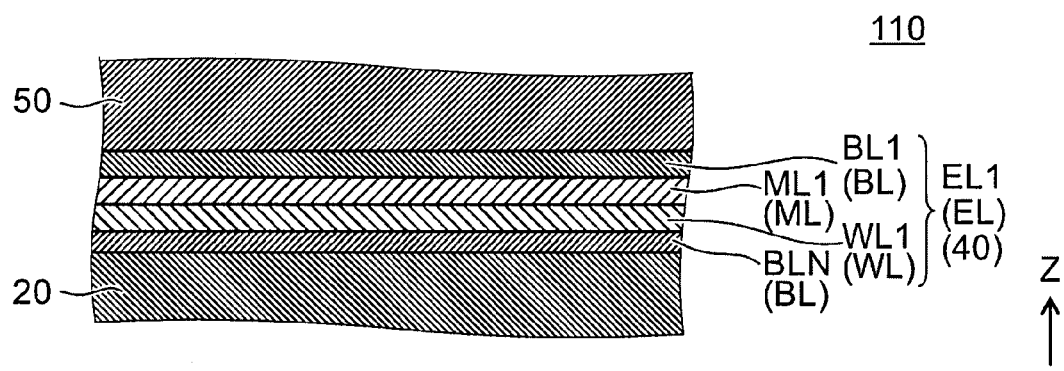
FIG. 1A and FIG. 1B are schematic cross-sectional views illustrating the configuration of a semiconductor light emitting device according to an embodiment.

In general, according to one embodiment, a semiconductor light emitting device includes an n-type semiconductor layer, a p-type semiconductor layer, and a light emitting part. The n-type semiconductor layer includes a nitride semiconductor. The p-type semiconductor layer includes a nitride semiconductor. The light emitting part is provided between the n-type semiconductor layer and the p-type semiconductor layer and includes an n-side barrier layer and a first light emitting layer. The first light emitting layer includes a first barrier layer, a first well layer, and a first AlGaN layer. The first barrier layer is provided between the n-side barrier layer and the p-type semiconductor layer. The first well layer contacts the n-side barrier layer between the n-side barrier layer and the first barrier layer. The first AlGaN layer is provided between the first well layer and the first barrier layer. The first AlGaN layer has a layered-form and includes $Al_{z1}Ga_{1-z1}N$ ($0.25 < z1 \leq 1$). A peak wavelength $\lambda p$ of light emitted from the light emitting part is longer than 515 nanometers.

In general, according to another embodiment, a semiconductor light emitting device includes an n-type semiconductor layer, a p-type semiconductor layer, and a light emitting part. The n-type semiconductor layer includes a nitride semiconductor. The p-type semiconductor layer includes a nitride semiconductor. The light emitting part is provided between the n-type semiconductor layer and the p-type semiconductor layer and includes an n-side barrier layer and a first light emitting layer. The first light emitting layer includes a first barrier layer, a first well layer, and a first AlGaN layer. The first barrier layer is provided between the n-side barrier layer and the p-type semiconductor layer. The first well layer contacts the n-side barrier layer between the n-side barrier layer and the first barrier layer. The first AlGaN layer is provided between the first well layer and the first barrier layer. The first AlGaN layer has a layered-form and includes $Al_{z1}Ga_{1-z1}N$ ($0 < z1 \leq 1$). An Al composition ratio z1 in group III of the first AlGaN layer and a peak wavelength $\lambda p$ (nanometer) of light emitted from the light emitting part satisfies a condition of $1.15z1 > 0.0024\lambda p - 0.972 > 0.90z1$.

Various embodiments will be described hereinafter with reference to the accompanying drawings.

The drawings are schematic or conceptual; and the relationships between the thicknesses and widths of portions, the proportions of sizes among portions, etc., are not necessarily the same as the actual values thereof. Further, the dimensions and the proportions may be illustrated differently among the drawings, even for identical portions.

In the specification and the drawings of the application, components similar to those described in regard to a drawing thereinabove are marked with like reference numerals, and a detailed description is omitted as appropriate.

(Embodiment)

Figure 1B:
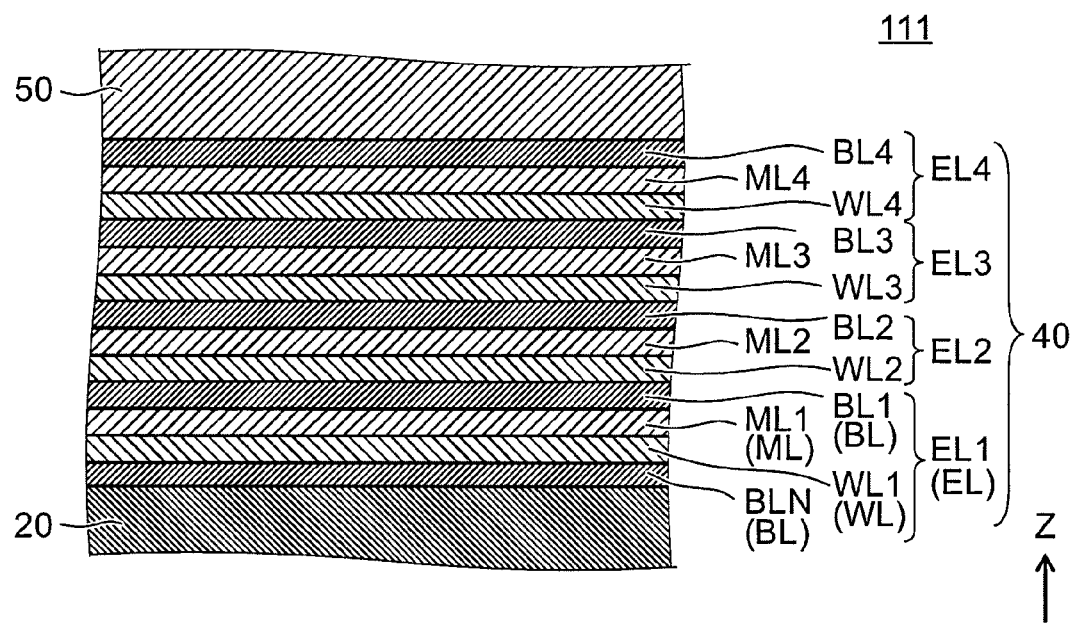

FIG. 1A and FIG. 1B are schematic cross-sectional views illustrating the configurations of semiconductor light emitting devices according to an embodiment.

As shown in FIG. 1A, a semiconductor light emitting device 110 according to the embodiment includes an n-type semiconductor layer 20, a p-type semiconductor layer 50 and a light emitting part 40.

The n-type semiconductor layer 20 and the p-type semiconductor layer 50 respectively include nitride semiconductors.

The light emitting part 40 is provided between the n-type semiconductor layer 20 and the p-type semiconductor layer 50. The light emitting part 40 includes an n-side barrier layer BLN and a first light emitting layer EL1. This first light emitting layer EL1 is provided between the n-side barrier layer BLN and the p-type semiconductor layer 50.

The first light emitting layer EL1 includes a first barrier layer BL1, a first well layer WL1 and a first AlGaN layer ML1.

The first barrier layer BL1 is provided between the n-side barrier layer BLN and the p-type semiconductor layer 50. The first well layer WL1 contacts the n-side barrier layer BLN between the n-side barrier layer BLN and the first barrier layer BL1. The first AlGaN layer ML1 is provided between the first well layer WL1 and the first barrier layer BL1, and includes $Al_{z1}Ga_{1-z1}N$ ($0.25 < z1 \leq 1$). This first AlGaN layer ML1 is formed in a layer.

In the semiconductor light emitting device 110, a single well layer WL is provided. As such, the light emitting part 40 may have a single quantum well (SQW: Single Quantum Well) structure.

As shown in FIG. 1B, in another semiconductor light emitting device 111 according to the embodiment, the light emitting part 40 further includes a second light emitting layer EL2. This second light emitting layer EL2 includes a second barrier layer BL2, a second well layer WL2 and a second AlGaN layer ML2.

The second barrier layer BL2 is provided between the first barrier layer BL1 and the p-type semiconductor layer 50. The second well layer WL2 contacts the first barrier layer BL1 between the first barrier layer BL1 and the second barrier layer BL2. The second AlGaN layer ML2 is provided between the second well layer WL2 and the second barrier layer BL2, and includes $Al_{z2}Ga_{1-z2}N$ ($0.25 < z2 \le 1$). The second AlGaN layer ML2 is formed in a layer.

In the semiconductor light emitting device 111, a plurality of well layers WL is provided. As such, the light emitting part 40 may have a multiple quantum well (MQW: Multiple Quantum Well) structure. In the semiconductor light emitting device 111, the number of the well layers WL is four. Namely, the number of the light emitting layers EL is four. However, the number of well layers WL is arbitrary in the semiconductor light emitting device according to the embodiment.

The light emitting part 40 includes, for example, a plurality of light emitting layers EL (the first light emitting layer EL1 to the n-th light emitting layer ELn). Here, "n" is an integer of two or larger.

Here, it is assumed that the (i+1)-th light emitting layer EL(i+1) be provided between the i-th light emitting layer ELi and the p-type semiconductor layer 50. Here, "i" is an integer of one or larger.

The i-th light emitting layer ELi includes an i-th barrier layer BLi, an i-th well layer WLi and an i-th AlGaN layer MLi.

The (i+1)-th barrier layer BL(i+1) is provided between the i-th barrier layer BLi and the p-type semiconductor layer 50. The (i+1)-th well layer WL(i+1) contacts the i-th barrier layer BLi between the i-th barrier layer BLi and the (i+1)-th barrier layer BL(i+1). The (i+1)-th AlGaN layer ML(i+1) is provided between the (i+1)-th well layer WL(i+1) and the (i+1)-th barrier layer BL(i+1), and includes $Al_{zi}Ga_{1-zi}N$ ($0.25 < zi \le 1$). The (i+1)-th AlGaN layer ML(i+1) is formed in a layer.

Hereinafter, the first barrier layer BL1 to the n-th barrier layer BLn may be generically referred to as barrier layers BL. The first well layer WL1 to the n-th well layer WLn may be generically referred to as well layers WL. The first AlGaN layer ML1 to the n-th AlGaN layer MLn may be generically referred to as AlGaN layers ML.

The plurality of AlGaN layers may have the same Al composition ratio (Al composition ratio in group III) and may have mutually different Al composition ratios. In an arbitrary AlGaN layer, however, the Al composition ratio z is set to $0.25 < z \le 1$. In the following, it is assumed that the plurality of AlGaN layers have the same Al composition ratio (constant Al composition ratio z) to simplify the explanations.

A bandgap energy of the i-th well layer WLi is smaller than that of the i-th barrier layer BLi, and is smaller than that of the n-side barrier layer BLN.

For the well layer WL, for example, an InGaN layer is used, and for the barrier layer BL, for example, the GaN layer is used. When the InGaN layer is used for the barrier layer BL, the In composition ratio (In composition ratio in group III) in the barrier layer BL is lower than that in the well layer WL.

The thickness of the well layer WL is, for example, in a range of not less than 1.0 nanometer (nm) and not more than 5.0 nm. When the thickness of well layer WL is smaller than 1.0 nm, it is difficult to achieve emission of light having a longer wavelength than 515 nm. On the other hand, when the thickness of well layer WL is larger than 5.0 nm, degradation of the crystalline quality tends to occur. Furthermore, a spatial separation between the wavefunction of an electron and the wavefunction of a hole increases, and the light emission intensity tends to be lowered.

The thickness of the barrier layer BL is, for example, in a range of not less than 3 nm and not more than 50 nm. When the thickness of the barrier layer BL is smaller than 3 nm, a space between the well layers WL becomes narrower, which in turn tends to cause wavefunction interference between different well layers WL, or an alleviation of strain in these well layers WL. On the other hand, when the thickness of the barrier layer BL is larger than 50 nm, the light emitting layer EL becomes too thick, and thereby an operating voltage increases.

Figure 2:
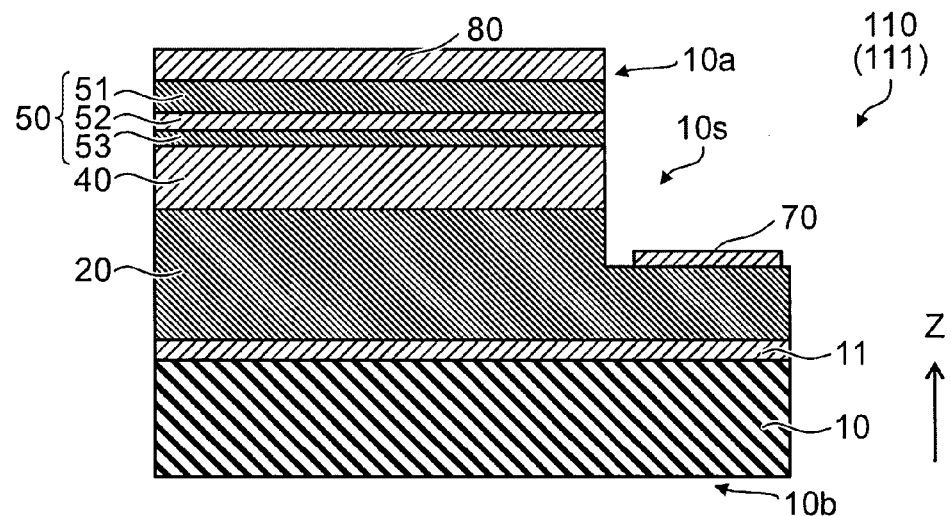
FIG. 2 is a schematic cross-sectional view illustrating the configuration of a semiconductor light emitting device according to the embodiment.

FIG. 2 is a schematic cross-sectional view illustrating the configuration of a semiconductor light emitting device according to the embodiment. As shown in FIG. 2, the semiconductor light emitting device 110(111) according to the embodiment further includes a substrate 10 and a buffer layer 11. The substrate 10 and the buffer layer 11 are provided as necessary, and may be omitted appropriately. The n-type semiconductor layer 20 is provided between the substrate 10 and the light emitting part 40. The buffer layer 11 is provided between the substrate 10 and the n-type semiconductor layer 20.

For the substrate 10, for example, sapphire may be used. For the substrate 10, for example, sapphire (0001) substrate may be used. Furthermore, SiC substrate, Si substrate or GaN substrate may be used for the substrate 10. For the buffer layer 11, for example, a GaN layer may be used. On the buffer layer 11, the n-type semiconductor layer 20, the light emitting part 40 and the p-type semiconductor layer 50 are formed sequentially. After the above-mentioned semiconductor layer is formed on the buffer layer 11, the substrate 10 and the buffer layer 11 may be removed.

A stacked body 10s which includes the n-type semiconductor layer 20, the light emitting part 40 and the p-type semiconductor layer 50 has a first major surface 10a and a second major surface 10b. The first major surface 10a is formed on the side of the p-type semiconductor layer 50, and the second major surface 10b is formed on the side of the n-type semiconductor layer 20.

In this example, a part of the n-type semiconductor layer 20 faces the p-type semiconductor layer 50. On the side of first major surface 10a, a p-side electrode 80 is provided in contact with the p-type semiconductor layer 50. Further, on the side of the first major surface 10a, an n-side electrode 70 is provided in contact with the n-type semiconductor. Here, as mentioned above, the substrate 10 (and the buffer layer 11) may be removed, and the n-side electrode 70 may contact the n-type semiconductor layer 20 on the side of the second major surface 10b.

Here, the direction going from the n-type semiconductor layer 20 toward the p-type semiconductor layer 50 is assumed to be a Z-axis direction. An axis perpendicular to this Z-axis is assumed to be an X-axis. An axis perpendicular to both the Z-axis and the X-axis is assumed to be a Y-axis.

The n-type semiconductor layer 20 includes, for example, an n-side contact layer. For this n-side contact layer, the GaN layer containing n-type impurities is used. For the n-type impurities, for example, Si (silicon) is used.

The p-type semiconductor layer 50 may include, for example, a first p-type layer 51, a second p-type layer 52 and a third p-type layer 53. The second p-type layer 52 is provided between the first p-type layer 51 and the light emitting part 40. The third p-type layer 53 is provided between the second p-type layer 52 and the light emitting part 40. For the third p-type layer 53, for example, a p-type AlGaN layer is used. This third p-type layer 53 can serve, for example, as an electron overflow blocking layer (current overflow blocking layer). The third p-type layer 53 may be omitted. For the second p-type layer 52, an Mg-dopted p-type GaN layer is used. For the first p-type layer 51, a high concentration Mg-doped p-type GaN layer may be used. This p-type layer 51 serves as a contact layer. For the p-type impurities, for example, Mg (magnesium) may be used.

The major surface of the n-type semiconductor layer 20 is a c-face. The major surface of the p-type semiconductor layer 50 is also a c-face. However, for example, the major surface of the n-type semiconductor layer 20 and the major surface of the p-type semiconductor layer 50 may be slightly inclined from the c-face.

For the n-side electrode 70, for example, a composite film of titanium-platinum-gold (Ti/Pt/Au) is used.

For the p-side electrode 80, for example, indium tin oxide (ITO) or the like may be used. For the p-side electrode 80, a composite film of nickel-gold (Ni/Au) or the like may be used.

The semiconductor light emitting device according to the embodiment may further includes a multilayer stacked body provided between the n-type semiconductor layer 20 and the light emitting part 40.

Figure 3:
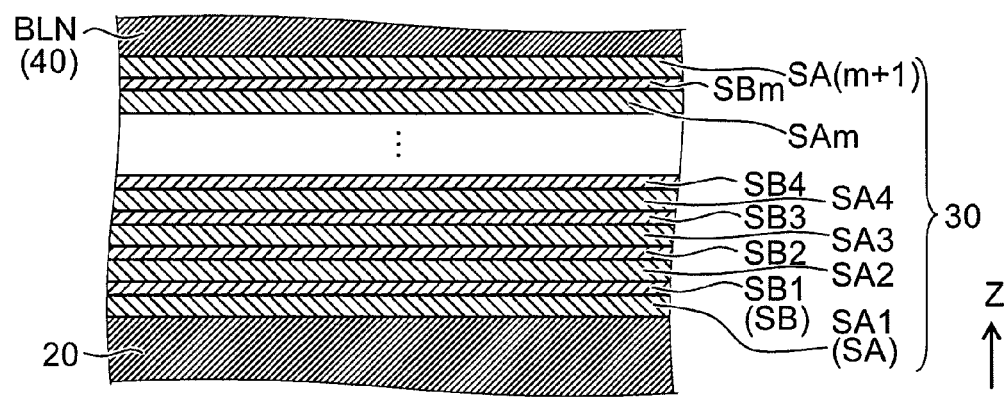
FIG. 3 is a schematic cross-sectional view illustrating the configuration of a part of the semiconductor light emitting device according to the embodiment.

FIG. 3 is a schematic cross-sectional view illustrating the configuration of a part of the semiconductor light emitting device according to the embodiment. Specifically, FIG. 3 illustrates an examplary configuration of a multilayer stacked body 30. This multilayer stacked body 30 is provided between the n-type semiconductor layer 20 and the light emitting part 40.

The multilayer stacked body 30 includes a plurality of thick film layers SA and a plurality of thin film layers SB, which are alternately stacked along the +Z direction. Here, the thickness of the thin film layer SB is equal to or smaller than that of the thick film layer SA. The thin film layer SB has a composition different from that of the thick film layer SA.

The plurality of thin film layers SB, for example, includes a first thin film layer SB1 to an m-th thin film layer SBm. Here, "m" is an integer of two or larger. The plurality of thick film layers SA includes a first thick film layer SA1 to an m-th thick film layer SAm. The plurality of thick film layers SA may further include an (m+1)-th thick film layer SA(m+1). The multilayer stacked body 30 may have, for example, a superlattice structure.

The thickness of the thick film layer SA is, for example, in a range of not less than 1 nm and not more than 3 nm. The thickness of the thin film layer SB is, for example, less than 1.5 nm, and is not more than the thickness of thick film layer SA.

The multilayer stacked body 30 may include a nitride semiconductor.

Specifically, the thick film layer SA includes, for example, GaN. The thin film layer SB includes InGaN. For the thick film layer SA, for example, the GaN layer substantially not including In is used. In the case where the multilayer stacked body 30 includes an InGaN layer, it is preferable that the In composition be lower than that in the well layer WL which will grow later. The multilayer stacked body 30 is provided as necessary, and may be omitted appropriately. In the following, explanations will be given through the case where the multilayer stacked body 30 is provided.

In the semiconductor light emitting device 110(111) according to the embodiment, the peak wavelength λp of the light emitted from the light emitting part 40 is longer than 515 nm. Namely, when the peak wavelength λp exceeds 515 nm, an AlGaN layer which has a higher Al composition ratio z than 0.25 is provided between the well layer WL and the barrier layer BL formed on the side of the p-type semiconductor layer 50 when seen from the well layer WL. As a result, a high luminance can be achieved.

This characteristic was found by the following experiments. In the following, an original experiment performed by inventors will be explained.

For the following method of growing semiconductor layers, the MOVPE (Metal-Organic Vapor Phase Epitaxy) was used.

First, a thermal cleaning of the substrate 10 of sapphire (0001) was performed at a susceptor temperature of 1100° C. Next, the susceptor temperature was decreased to 500° C., and the buffer layer 11 (GaN layer) was grown on the major surface of the substrate 10. Next, after the susceptor temperature was increased to 1120° C., a Si-doped n-type GaN layer was grown as the n-type semiconductor layer 20.

Thereafter, the multilayer stacked body 30 was formed. Specifically, carrier gas was changed from $H_2$ gas into $N_2$ gas, and the susceptor temperature was decreased to 850° C. Then, layers of 20 periods, each period having an $In_{0.08}Ga_{0.92}N$ layer with a thickness of 1 nm (thin film layer SB) and a GaN layer with a thickness of 3 nm (thick film layer SA), were formed. As a result, the multilayer stacked body 30 was formed. Here, at least any of the thin film layer SB and the thick film layer SA may contain Si. This multilayer stacked body 30 may include a function as the n-type semiconductor layer 20.

Then, the growth was interrupted, and the susceptor temperature was increased to 950° C. At this temperature, the n-side barrier layer BLN was grown. In this experiment, the Si-doped GaN layer was grown as the n-side barrier layer BLN. The thickness of the n-side barrier layer BLN is 12.5 nm. Here, the n-side barrier layer BLN may not be doped with Si.

Thereafter, the susceptor temperature was decreased to temperatures in a range of not less than 700° C. and not more than 800° C., and the InGaN layer was grown as the first well layer WL1. The first well layer WL1 has a thickness around 3 nm, and an In composition ratio of 0.23.

Thereafter, continuously, the $Al_{0.30}Ga_{0.70}N$ layer with a thickness of 1.5 nm was grown as the first AlGaN layer ML1, and further the GaN layer with a thickness of 0.5 nm to become a first cap layer was grown thereon.

Namely, the first AlGaN layer ML1 and the first cap layer are grown substantially at the same temperature as the growth temperature of the first well layer WL. As a result, the first well layer WL1 and the first AlGaN layer ML1 can be maintained flat.

Next, the susceptor temperature was increased to 850° C., and the GaN layer to become the first barrier layer BL1 was grown. The thickness of this GaN layer is 12.5 nm.

As a result, the first light emitting layer EL1 was formed. Subsequently, the second light emitting layer EL2 to the fourth light emitting layer EL4 were formed in the same manner as the above.

Thereafter, an Mg-doped AlGaN layer was formed as the third p-type layer 53. An Mg-doped GaN layer was then formed as the second p-type layer 52. Subsequently, a high concentration Mg-doped GaN layer was formed as the third p-type layer 53. As a result, the p-type semiconductor layer 50 was formed.

Then, the sample was taken out of the reaction chamber, and the semiconductor light emitting device 111 was formed after having gone through the etching and the electrode forming processes and the like.

In the above, a plurality of semiconductor light emitting devices 111 can be obtained from a single wafer (substrate 10). In this experiment, when the peak wavelength λp of light emitted from a plurality of semiconductor light emitting devices 111 was measured, peak wavelengths λp were different among the plurality of semiconductor light emitting devices 111. These variations in peak wavelengths λp were based on, for example, variations of In composition ratio z in the wafer surface of the well layers WL, and variations in thickness in the wafer surface of the well layers WL and the like. As a result, the plural semiconductor light emitting devices 111, having different peak wavelengths λp, were obtained.

Samples in which the Al composition ratio z in the AlGaN layer ML was varied were also prepared using the above process. Samples having the Al composition ratios z in the AlGaN layer ML of 0.09, 0.14 and 0.18 were prepared as a semiconductor light emitting device 119a according to the first reference example, a semiconductor light emitting device 119b according to the second reference example and a semiconductor light emitting device 119c according to the third reference example, respectively.

Further, a sample without having formed therein the AlGaN layer ML (the semiconductor light emitting device 119d according to the fourth reference example) was also prepared. In this semiconductor light emitting device 119d, the cap layer was formed continuously after the well layer WL was formed. The temperature was then increased as explained above to grow the barrier layer BL. Thereafter, the foregoing process was repeated, thereby forming the light emitting part 40. The processes other than the above were the same as those for the preparation of the semiconductor light emitting device 111.

For the semiconductor light emitting devices 119a to 119d of the first through fourth reference examples, a plurality of semiconductor light emitting devices having mutually different peak wavelengths λp were also obtained from the respective wafers.

Figure 4:
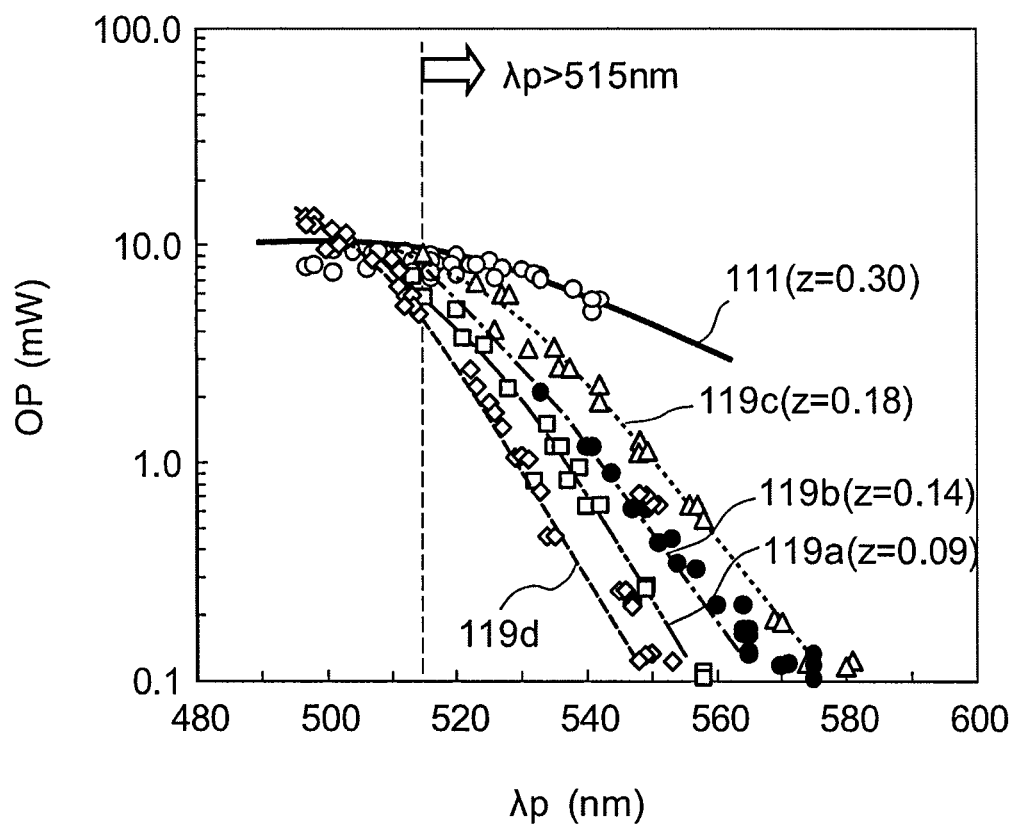
FIG. 4 is a graph illustrating characteristics of the semiconductor light emitting devices.

FIG. 4 is a graph illustrating characteristics of the semiconductor light emitting device. Namely, FIG. 4 show results of measurements on the characteristics of the semiconductor light emitting devices 119a to 119d according to the first through fourth reference examples. In the graph, the horizontal axis corresponds to the peak wavelength λp in the sample of each semiconductor light emitting device. The vertical axis corresponds to an output power OP (in logarithmic expression). Here, the output power OP indicates a value when the forward current was 20 mA.

As shown in FIG. 4, in each of the semiconductor light emitting device 111 and the semiconductor light emitting devices 119a to 119d according to the first through fourth reference examples, output powers OP were lowered as the peak wavelength λp becomes longer.

Particularly, in the semiconductor light emitting device 119d according to the fourth reference example without having the AlGaN layer ML, the output power OP was lowered significantly when the peak wavelength λp became longer than 500 nm.

In the semiconductor light emitting devices 119a to 119c according to the first to third reference examples, although a decrease in output power OP in the region of a longer wavelength than 500 nm was improved as compared to the case of the semiconductor light emitting device 119d, the improvements were insufficient.

In contrast, in the semiconductor light emitting device 111 according to the embodiment, a decrease in output power OP in the region of a longer wavelength than 500 nm was remarkably improved.

On the other hand, in the semiconductor light emitting device 111, in the region of a shorter wavelength than 500 nm, an output power OP was at the same level as or even lower than those of the reference examples.

As described, under the conditions that the AlGaN layer ML is used, and the Al composition ratio z is as high as 0.3, an output power OP in the region of a longer wavelength than 500 nm is improved as compared to the reference examples.

From the results shown in FIG. 4, according to the semiconductor light emitting device 111 of the embodiment, when the Al composition ratio z is set to 0.3 or higher, the output power OP is reliably improved from the reference examples in the region of a longer wavelength than 515 nm.

Additionally, although the above experiment was performed using the AlGaN layer ML with the Al composition ratio z of 0.3, taking into consideration the difference from the characteristics of the semiconductor light emitting device 119c according to the third reference example with the Al composition ratio z of 0.18, it can be recognized that the output power OP is reliably improved in the region of a longer wavelength than 515 nm under the condition that the Al composition ratio z of the AlGaN layer ML is higher than 0.25.

The configuration of the embodiment is constructed on the basis of the foregoing characteristics newly discovered from these experiments.

Namely, in the semiconductor light emitting device in which the peak wavelength λp of light emitted from the light emitting part 40 is longer than 515 nm, the AlGaN layer ML including $Al_zGa_{1-z}N$ ($0.25 < z \leq 1$) is used. This AlGaN layer ML is provided between the well layer WL and the barrier layer WL on the side of the p-type semiconductor layer 50 of that well layer WL. Namely, the first AlGaN layer ML1 is provided between the first well layer WL and the first barrier layer BL1. With this configuration, a high luminance can be achieved.

It is considered that the reason why such high luminance can be achieved from the configuration according to the embodiment is that a reduction in light emission efficiency can be suppressed due to the quantum-confined Stark effect.

For example, in the case of the semiconductor light emitting device 119d according to the fourth reference example, a strain is applied to the well layer WL, which generates a piezoelectric field. Further, it is considered that with this piezoelectric field, an overlap integral value between the wavefunction of a hole and the wavefunction of an electron is decreased, which in turn decreases the light emission efficiency. Namely, in the fourth reference example, for example, the wavefunction of an electron of the well layer WL is protruded to the side of the p-type semiconductor layer 50. Particularly, in the well layer WL of a longer wavelength than 500 nm, the strain becomes larger, and therefore the foregoing tendency becomes more outstanding.

In this state, by disposing the AlGaN layer ML on the side of the p-type semiconductor layer 50 in the well layer WL, it is possible to suppress the leakage of electrons to the side of the p-type semiconductor layer 50. Specifically, an electron has a small effective mass. Thus, by disposing the AlGaN layer ML, the wavefunction of an electron is shifted more to the side of n-type semiconductor layer 20 than the wavefunction of a hole. As a result, it is possible to increase an overlap integral value between the wavefunction of a hole and the wavefunction of an electron.

The foregoing effect can be appreciated more for the higher Al composition ratio z in the AlGaN layer ML. This is consistent with the results shown in FIG. 4.

It can be seen from the experimental results shown in FIG. 4 that improvements in luminance can be fully appreciated when the Al composition ratio z in the AlGaN layer ML is higher than 0.25.

In the embodiment, however, when the Al composition ratio z in the AlGaN layer ML is excessively high, crystalline quality may be adversely affected. Moreover, when the Al composition ratio z is excessively high, an effect of shifting the wavefunction of an electron is exhibited excessively, and an overlap integral value between the wavefunction of an electron and the wavefunction of a hole tends to be decreased on the contrary, resulting in a decrease in light emission efficiency. As described, there may exist an appropriate relationship between the peak wavelength $\lambda p$ and the Al composition ratio z in the AlGaN layer ML. Therefore, it is more preferable that the Al composition ratio z in the AlGaN layer ML be set in a range of more than 0.25 and not more than 0.5. With this configuration, it is possible to realize both high luminance and desirable crystalline quality. As a result, a semiconductor light emitting device of high luminance and high efficiency can be obtained.

In the embodiment, the major surface of the substrate 10 is a c-face. With this configuration, a major surface of each crystalline layer (the n-type semiconductor layer 20, the light emitting layer EL and the p-type semiconductor layer 50, and the like) is a c-face which is a polar face. In this case, the foregoing quantum-confined Stark effect by the piezoelectric field tends to occur. In response, the embodiment adopts the AlGaN layer ML to suppress such effect.

Additionally, it may be arranged (as a reference example) such that the AlGaN layer is provided between the well layer WL and the barrier layer BL formed on the side of the n-type semiconductor layer 20 of that well layer WL. However, with this configuration, the wavefunction of an electron is shifted in a direction opposite to the above-explained direction. Thus, it is considered that the effect of suppressing a reduction in light emission efficiency caused by the quantum-confined Stark effect cannot be expected.

Specifically, for example, in the first light emitting layer EL1, $In_{x2}Ga_{1-x2}N$ ($0 \leq x2 < 1$) is used for the n-side barrier layer BLN in contact with the first well layer WL1. Moreover, $In_{x1}Ga_{1-x1}N$ ($0 \leq x1 < 1$) is used for the barrier layer BL (the first barrier layer BL1 and the like).

Figure 5:
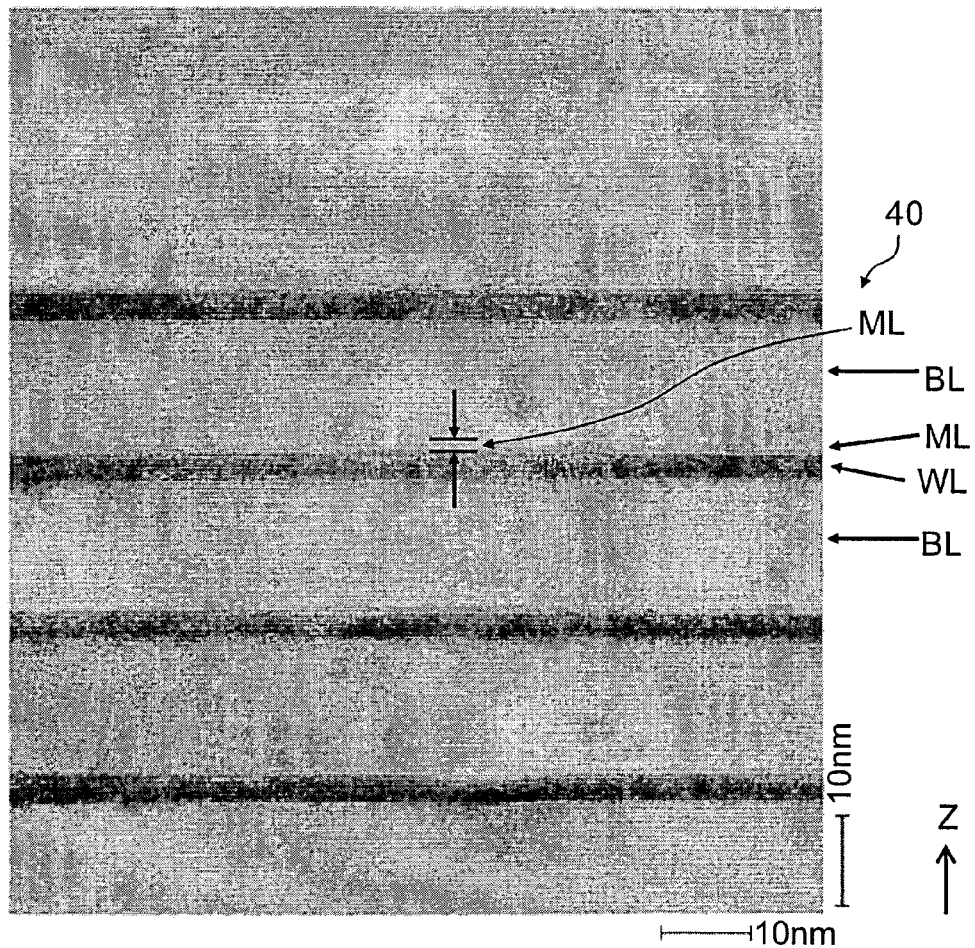
FIG. 5 is a transmission electron microscope image illustrating the configuration of the semiconductor light emitting device according to the embodiment.

FIG. 5 is a transmission electron microscope image illustrating the configuration of the semiconductor light emitting device according to the embodiment.

FIG. 5 is an image of a cross-section of a crystalline layer (light emitting part 40) of the semiconductor light emitting device 111.

As shown in FIG. 5, in the semiconductor light emitting device 111, the AlGaN layer ML is formed in a layer. For example, neither the regions where through holes are formed nor the deeply recessed regions are formed in the AlGaN layer ML. For example, a part of the well layer WL is not substantially in contact with the barrier layer BL resulting from an exposed part of the well layer WL due to the recession or the through holes of the AlGaN layer ML.

In FIG. 5, in each layer of the AlGaN layer ML, flatness at an atomic-level is observed. For example, an RMS value for the thickness of the AlGaN layer ML (the first AlGaN layer ML1 and the like) is 0.5 nm or smaller.

There is an attempt to lower a threshold voltage or a drive voltage of the device by disposing an intermediate layer of AlGaN on the well layer. In this case, the intermediate layer of AlGaN has a net structure in which a plurality of recessed regions and penetrated regions are formed in the surface thereof. The foregoing recessed regions and penetrated regions occupy 10% or more of the surface of the intermediate layer. It is considered that such net structure is formed in the following manner. That is, the intermediate layer is formed at low temperatures, and then the temperature is raised to the growth temperature of the barrier layer formed on the intermediate layer. In this state, the intermediate layer and the like are resolved, thereby forming the net structure.

In contrast, according to the embodiment, the cap layer is formed on the AlGaN layer ML as described above. Here, temperatures at which this cap layer is formed are around the same temperatures at which the AlGaN layer ML is formed (the same temperatures in the case of the above experiment). Then, after forming the cap layer, the temperature is increased to high temperatures, at which the barrier layer BL is formed. By carrying out these processes, it is possible to suppress a part of the AlGaN layer ML from being resolved. Therefore, according to the embodiment, the layer form in the grown state can be maintained in the AlGaN layer ML. Namely, the AlGaN layer ML does not have a net structure.

According to the embodiment, in the AlGaN layer ML, an area of the recessed regions or regions in which through holes are formed occupies less than 10% of the area of the layer surface of the AlGaN layer ML. Namely, substantially no such region exists.

If the barrier layer BL is formed on the AlGaN layer ML at high temperatures in the state where the cap layer is not formed, a deformation occurs in the AlGaN layer ML. Further, it is considered that such deformation becomes outstanding particularly when the Al composition ratio z is higher than 0.25.

On the contrary, when the AlGaN layer ML is formed in a layer (flat) in the AlGaN layer ML having a higher Al composition ratio z than 0.25, it can be assumed that the barrier layer BL is formed at high temperatures after forming the foregoing cap layer.

Figure 6:
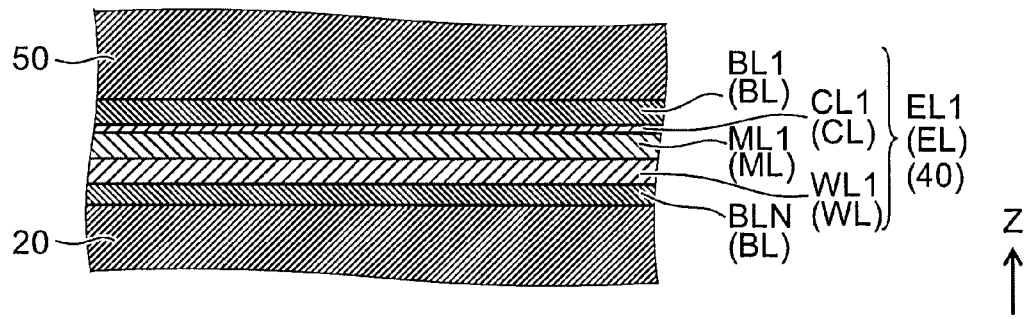
FIG. 6 is a schematic cross-sectional view illustrating the configuration of a semiconductor light emitting device according to the embodiment.

FIG. 6 is a schematic cross-sectional view illustrating the configuration of a semiconductor light emitting device according to the embodiment.

As shown in FIG. 6, in the semiconductor light emitting device 112 according to the embodiment, the cap layer is formed. For example, the first light emitting layer EL1 further includes the first cap layer CL (cap layer CL) which is in contact with both the first AlGaN layer ML1 and the first barrier layer BL1 and which includes a nitride semiconductor.

As a result, the layer form is maintained in the first AlGaN layer ML1. This cap layer CL may be or may not be observed, for example, by the analytical method such as the transmission electron microscopy observation or the like.

The semiconductor light emitting device 112 shown in FIG. 6 has a single quantum well (SQW) structure. However, the embodiment is not limited to this, and the cap layer CL may be formed in the semiconductor light emitting device 111 of an MQW structure.

Specifically, it may be arranged such that in the case where a plurality of light emitting layers EL is provided, the i-th light emitting layer ELi may further include an i-th cap layer CLi which is in contact with both the i-th AlGaN layer MLi and the i-th barrier layer BLi and which includes a nitride semiconductor.

As a result, the AlGaN layer ML is formed in a layer. Namely, this AlGaN layer ML does not have a net structure. For example, the RMS value for the thickness of the AlGaN layer ML becomes 0.5 nm or smaller. In this example, the thickness of the AlGaN layer ML is around 1.5 nm. Thus, variations in thickness are plus or minus 33% or smaller (0.5 nm/1.5 nm) of an average thickness of the AlGaN layer ML.

In the embodiment, it is preferable that the growth temperatures of the barrier layer BL be not lower than the growth temperatures of the well layer WL, and that a difference between the growth temperatures of the barrier layer BL and the growth temperatures of the well layer WL be 200° C. or smaller. If the growth temperatures of the barrier layer BL are lower than the growth temperatures of the well layer WL, pits tend to generate in the barrier layer BL. Moreover, if the growth temperatures of the barrier layer BL are higher than the growth temperatures of the well layer WL, and the difference between the growth temperatures of the barrier layer BL and the growth temperatures of the well layer WL becomes larger than 200° C., the well layer WL tends to deteriorate.

In the embodiment, it is preferable that the thickness of the n-side barrier layer BLN be in a range of not less than 3 nm and not more than 20 nm. When the thickness of the n-side barrier layer BLN is less than 3 nm, a sufficient flatness of the surface cannot be obtained. On the other hand, when the thickness of the n-side barrier layer BLN is larger than 50 nm, it is liable that the effect of alleviating the strain of crystals by the multilayer stacked body 30 becomes less effective and the drive voltage becomes higher. Namely, when the thickness of the n-side barrier layer BLN is set in a range of not less than 3 nm and not more than 50 nm, it is possible to realize high flatness, high crystalline quality and high light emission efficiency.

Additionally, in the process of forming the n-side barrier layer BLN, it is preferable that $N_2$ gas be used for the carrier gas when the susceptor temperature is in a range of not less than 600° C. and not more than 1000° C. Here, $H_2$ gas may be further added. In this case however, an amount of flow of $H_2$ gas is set to or below a half of the total amount of gas flow. As a result, high crystalline quality can be achieved with ease.

From the experimental results shown in FIG. 4, it is considered that there should be an appropriate relationship between the peak wavelength $\lambda p$ and the Al composition ratio z in the AlGaN layer ML to realize a high luminance (output power OP). Regarding this, explanations will be given below.

Figure 7:
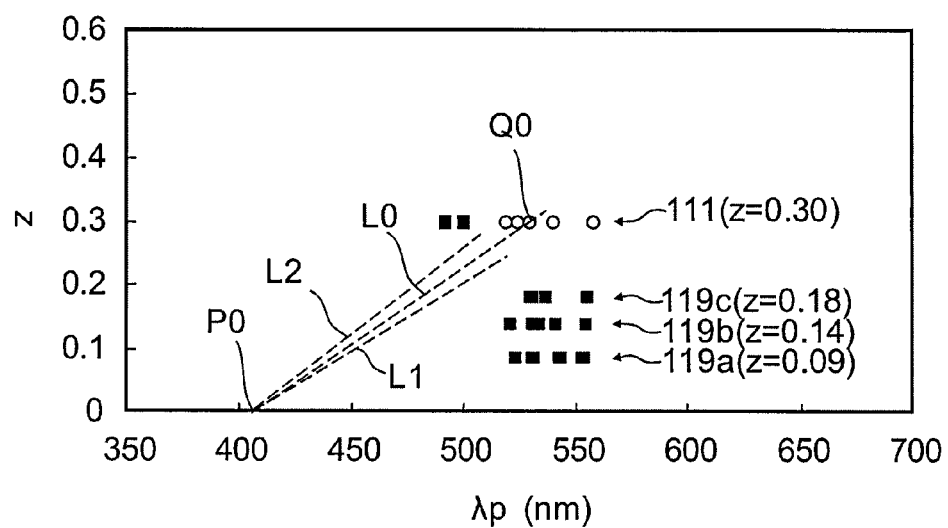
FIG. 7 is a graph illustrating an example of characteristics of the semiconductor light emitting devices.

FIG. 7 is a graph illustrating an example of characteristics of the semiconductor light emitting device.

This figure is plotted based on the experimental data shown in FIG. 4. In FIG. 7, the horizontal axis indicates a peak wavelength $\lambda p$, and the vertical axis indicates an Al composition ratio z in the AlGaN layer ML.

A white circular mark in FIG. 7 indicates the Al composition ratio z at which a high output power OP is obtained for the indicated peak wavelength $\lambda p$ among the Al composition ratios z of 0.09, 0.14, 0.18 and 0.30. A black square mark indicates the Al composition ratio z at which an output power OP is relatively low for the indicated peak wavelength $\lambda p$ among the Al composition ratios z of 0.09, 0.14, 0.18 and 0.30.

As can be seen from the example shown in FIG. 7, in the case where the Al composition ratio z is 0.30 (semiconductor light emitting device 111), the output power OP is high when the peak wavelength $\lambda p$ is longer than 515 nm. However, the output power OP is low when the peak wavelength $\lambda p$ is 500 nm or shorter.

In the region where the peak wavelength $\lambda p$ is longer than 515 nm, when the Al composition ratio z is 0.18 or lower, a high output power OP cannot be achieved.

On the other hand, in the relationship between the peak wavelength $\lambda p$ and an optical output, it is known that emission of light can be obtained at the highest efficiency in the range of 400 nm to 420 nm. In view of this, for example, in the nitride semiconductor light source (for Blu-ray Disc etc., for example) having a similar configuration to that of the fourth reference example without using the AlGaN layer ML, the wavelength of 405 nm, which provides light emission at high efficiency, is used. Based on this, it can be assumed that an appropriate Al composition ratio z when peak wavelength $\lambda p$ is 405 nm is zero. This condition is indicated by the point P0 in FIG. 7.

On the other hand, the condition under which a high output power OP can be obtained obviously when the Al composition ratio z is 0.3 is indicated by the point Q0 in FIG. 7.

It is considered that the effect of providing the AlGaN layer ML is exhibited under the condition shown in the region around the line (center condition line L0) connecting the above point P0 and the point Q0. The Center condition line L0 is z=0.0024 $\lambda p$−0.972. Here, z is an Al composition ratio in group III elements in the AlGaN layer ML. The $\lambda p$ (nanometer) indicates a peak wavelength of light emitted from the light emitting part 40.

Further, as shown in FIG. 7, a high output power OP is obtained under the conditions (conditions indicated by the region enclosed by a first boundary condition line L1 and a second boundary condition line L2) around the center condition line L0. The first boundary condition line L1 is defined by 1.15z=0.0024 $\lambda p$−0.972. The second boundary condition line L2 is defined by 0.90 z=0.0024 $\lambda p$−0.972.

Therefore, a high output power OP can be achieved when the Al composition ratio z and the peak wavelength $\lambda p$ satisfy the following condition:

$$1.15z > 0.0024\lambda p - 0.972 > 0.90z.$$

In the first light emitting layer EL1, a high output power OP can be achieved when the Al composition ratio z1 of the first AlGaN layer ML1 and the peak wavelength $\lambda p$ satisfy the following condition:

$$1.15z1 > 0.0024\lambda p - 0.972 > 0.90z1.$$

When the above condition is satisfied, a high luminance is achieved in the wavelength region of 515 nm or shorter. Further, also when the Al composition ratio z in the AlGaN layer ML is 0.25 or smaller, a high luminance is obtained.

In the embodiment, the Al composition ratio z can be measured by means of, for example, an Energy Dispersive X-ray Spectrometry (EDX), etc. Additionally, a Secondary Ion-microprobe Mass Spectrometer (SIMS), or a structural analysis method by an omega-2theta scan using an X-ray diffraction (XRD).

The thickness of a crystalline layer such as the AlGaN layer can be obtained, for example, based on a transmission electron microscope image of a cross-section of the crystalline layer.

Each semiconductor layer in the semiconductor light emitting device according the embodiment may be grown using a growth method such as Metal-Organic Chemical Vapor Deposition (MOCVD), Metal-Organic Vapor Phase Epitaxy (MOVPE) or the like.

When forming each semiconductor layer, the following materials may be used for raw materials.

For a Ga raw material, for example, TMGa (trimethylgallium), TEGa (triethylgallium) or the like may be used. For an In raw material, for example, TMIn (trimethylindium), TEIn (triethylindium) or the like may be used. For an Al raw material, for example, TMAI (trimethylaluminum) or the like may be used. For an N raw material, for example, $NH_3$ (ammonia), MMHy (monomethyl hydrazine), DMHy (dimethyl hydrazine) or the like may be used. For a Si raw material, for example, $SiH_4$ (monosilane) or the like may be used. For an Mg raw material, for example, $Cp_2Mg$ (bis(cyclopentadienyl) magnesium) or the like may be used.

According to the embodiment, a semiconductor light emitting device of high efficiency is provided.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which each of the compositional proportions x, y, and z are changed within the ranges. "Nitride semiconductor" further includes group V elements other than N (nitrogen) in the chemical formula recited above, various elements added to control various properties such as the conductivity type, etc., and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, one skilled in the art may similarly practice the invention by appropriately selecting specific configurations of components included in semiconductor light emitting devices such as n-type semiconductor layers, p-type semiconductor layers, light emitting parts, light emitting layers, well layers, barrier layers, AlGaN layers, and electrodes, included in light emitting apparatuses, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor light emitting devices practicable by an appropriate design modification by one skilled in the art based on the semiconductor light emitting devices described above as embodiments of the invention also are within the scope of the invention to the extent that the purport of the embodiments of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device, comprising:
    an n-type semiconductor layer including a nitride semiconductor;
    a p-type semiconductor layer including a nitride semiconductor; and
    a light emitting part provided between the n-type semiconductor layer and the p-type semiconductor layer and including an n-side barrier layer and a first light emitting layer,
    the first light emitting layer including:
        a first barrier layer provided between the n-side barrier layer and the p-type semiconductor layer;
        a first well layer contacting the n-side barrier layer between the n-side barrier layer and the first barrier layer; and
        a first AlGaN layer provided between the first well layer and the first barrier layer, the first AlGaN layer having a layered-form and including $Al_{z1}Ga_{1-z1}N$ ($0.25 < z1 \leq 1$).

2. The device according to claim 1, wherein a peak wavelength λp of light emitted from the light emitting part is longer than 515 nanometers.

3. The device according to claim 1, wherein a peak wavelength λp (nanometer) of light emitted from the light emitting part satisfies a condition of $1.15z1 > 0.0024 \lambda p - 0.972 > 0.90z1$.

4. The device according to claim 1, wherein a thickness of the first AlGaN layer has an RMS value of 0.5 nanometers or less.

5. The device according to claim 1, wherein a major surface of the n-type semiconductor layer is a c-face.

6. The device according to claim 1, wherein the first light emitting layer further includes a first cap layer contacting the first AlGaN layer and the first barrier layer and including a nitride semiconductor.

7. The device according to claim 1, wherein in the first AlGaN layer, an area of recessed regions or regions having through holes formed occupies less than 10% of a layer surface of the first AlGaN layer.

8. The device according to claim 1, wherein
    the first barrier layer includes $In_{x1}Ga_{1-x1}N$ ($0 \leq x1 < 1$), and
    the n-side barrier layer includes $In_{x2}Ga_{1-x2}N$ ($0 \leq x2 < 1$).

9. The device according to claim 1, wherein
    the light emitting part further includes a second light emitting layer; and
    the second light emitting layer includes,
        a second barrier layer provided between the first barrier layer and the p-type semiconductor layer,
        a second well layer contacting the first barrier layer between the first barrier layer and the second barrier layer, and
        a second AlGaN layer provided between the second well layer and the second barrier layer, the second AlGaN layer having a layered-form and including $Al_{z2}Ga_{1-z2}N$ ($0.25 < z2 \leq 1$).

10. The device according to claim 1, wherein a thickness of the first well layer is 1.0 nanometer or more and 5.0 nanometers or less.

11. The device according to claim 1, wherein a thickness of the first barrier layer is 3 nanometers or more and 50 nanometers or less.

12. The device according to claim 1, wherein a thickness of the n-side barrier layer is 3 nanometers or more and 20 nanometers or less.

* * * * *